(12) United States Patent
Posthuma et al.

(10) Patent No.: US 7,960,645 B2
(45) Date of Patent: *Jun. 14, 2011

(54) GERMANIUM SOLAR CELL AND METHOD FOR THE PRODUCTION THEREOF

(75) Inventors: Niels Posthuma, Leuven (BE); Giovanni Flamand, Oelegem (BE); Jef Poortmans, Kessel-lo (BE)

(73) Assignees: IMEC, Leuven (BE); Umicore NV, Brussels (BE)

( * ) Notice: Subject to any disclaimer, the term of this patent is extended or adjusted under 35 U.S.C. 154(b) by 1185 days.

This patent is subject to a terminal disclaimer.

(21) Appl. No.: 11/246,509

(22) Filed: Oct. 7, 2005

(65) Prior Publication Data

US 2007/0227589 A1  Oct. 4, 2007

Related U.S. Application Data

(63) Continuation-in-part of application No. 10/841,803, filed on May 6, 2004.

(60) Provisional application No. 60/468,752, filed on May 7, 2003.

(51) Int. Cl.
*H01L 31/00* (2006.01)

(52) U.S. Cl. ....................................................... 136/261

(58) Field of Classification Search .................. None
See application file for complete search history.

(56) References Cited

U.S. PATENT DOCUMENTS

| | | | |
|---|---|---|---|
| 3,686,036 A * | 8/1972 | Gereth | 136/256 |
| 4,319,395 A | 3/1982 | Lund et al. | |
| 4,468,853 A | 9/1984 | Morita et al. | |
| 4,473,597 A | 9/1984 | Pankove et al. | |
| 4,602,120 A | 7/1986 | Wakefield et al. | |
| 4,773,942 A | 9/1988 | Hamakawa et al. | |
| 4,926,229 A | 5/1990 | Nakagawa et al. | |
| 5,437,736 A | 8/1995 | Cole | |
| 6,210,991 B1 | 4/2001 | Wenham et al. | |
| 6,326,540 B1 | 12/2001 | Kilmer et al. | |
| 6,339,013 B1 | 1/2002 | Naseem et al. | |
| 6,982,218 B2 | 1/2006 | Preu et al. | |
| 2002/0007793 A1 | 1/2002 | Sakai et al. | |
| 2003/0003693 A1 | 1/2003 | Meier et al. | |
| 2003/0124761 A1 | 7/2003 | Baert et al. | |

(Continued)

FOREIGN PATENT DOCUMENTS

GB  1355890  6/1974

(Continued)

OTHER PUBLICATIONS

Witvrouw, et al.; Microsystem Technologies 6 (2000) 192-199; "Why CMOS-integrated transducers? A review."

(Continued)

*Primary Examiner* — Alexa D Neckel
*Assistant Examiner* — Miriam Berdichevsky
(74) *Attorney, Agent, or Firm* — Knobbe Martens Olson & Bear LLP

(57) ABSTRACT

A method is disclosed for passivating and contacting a surface of a germanium substrate. A passivation layer of amorphous silicon material is formed on the germanium surface. A contact layer of metal is then formed on the passivation. The structure is heated so that the germanium surface makes contact with the contact layer. Thus, a passivated germanium surface is disclosed, as well as a solar cell comprising such a structure.

24 Claims, 5 Drawing Sheets

U.S. PATENT DOCUMENTS

| | | | |
|---|---|---|---|
| 2003/0211704 | A1 | 11/2003 | Shaheen et al. |
| 2003/0230761 | A1* | 12/2003 | Morrison et al. ............. 257/184 |
| 2004/0118444 | A1* | 6/2004 | Duggal et al. ................ 136/244 |

FOREIGN PATENT DOCUMENTS

| | | |
|---|---|---|
| JP | 56-155526 | 12/1981 |
| JP | 05048127 | 2/1993 |
| WO | WO 89/12321 A1 | 6/1990 |
| WO | WO 01/74708 A2 | 10/2001 |

OTHER PUBLICATIONS

Singh, et al.; Sensors and Actuators 77 (1999) 133-138; "Strain studies in LPCVD polysilicon for surface micromachined devices."

Lin, et al; J. Electrochem. Soc., vol. 141, No. 9, Sep. 1994, 2559-2563; "Effects of $SiH_4$, $GeH_4$, and $B_2H_6$ on the Nucleation and Deposition of Polycrystalline $Si_{1-x}Ge_x$ Films."

King, et al.; J. Electrochem. Soc., vol. 141, No. 8, Aug. 1994, 2235-2240; "Deposition and Properties of Low-Pressure Chemical-Vapor Deposited Polycrystalline Silicon-Germanium Films".

Luke et al., 'Germanium Orthogonal Strip detectors with Amorphous-Semiconductor contacts', 1999 IEEE Nuclear Science Symposium Conference Record, Seattle WA, Oct. 25-28, 1999.

Luke et al., "Germanium Orthogonal Strip Detectors with Amorphous Semiconductor Contacts", 2000 IEEE, pp. 201-204.

D. K. Schroder, D. L. Meier, "Solar Cell Contact Resistance—A Review," IEEE Transactions on Electron Devices, vol. ED-31(5), 637-647 (1984).

Yong Liu, "High Growth Rate Deposition of Hydrogenated Amorphous Silicon-Germanium Films and Devices Using ECR-PECVD," Ph.D. thesis, Electrical Engineering (Microelectronics), Major Professor Vikram Dalai, OSTI ID 803355, Iowa State University, Ames, IA (2002).

Nguyen Van Dong, Y. Fornier and J. Y. Lee, "Electrical and optical properties of sputtered amorphous siicon films prepared under a reduced pumping speed," Applied Physics Letters 42(7) 594-596 (1983).

Office Action dated Jun. 4, 2007 in co-pending U.S. Appl. No. 10/841,803, filed May 6, 2004.

* cited by examiner

Cell 1: $S_{front} = 70000$ cm/s
Cell 2: $S_{front} = 50$ cm/s

GERMANIUM SOLAR CELL AND METHOD FOR THE PRODUCTION THEREOF

RELATED APPLICATIONS

This application is a continuation-in-part of U.S. application Ser. No. 10/841,803 filed May 6, 2004, which claims the benefit of priority under 35 U.S.C. §119(e) to U.S. Provisional Application No. 60/468,752 filed on May 7, 2003. All above-referenced prior applications are incorporated by reference herein in their entirety and are hereby made a portion of this specification.

FIELD OF THE INVENTION

The present invention is related to the field of germanium solar cells, germanium photovoltaic cells and germanium photodetectors.

BACKGROUND OF THE INVENTION

To achieve solar cells that convert energy with efficiencies up to 40 percent, quadruple junctions are being investigated. Fabricating such cells is relevant for instance for space applications, because the total array weight and thus the launching cost can be reduced by increasing the energy conversion efficiency. For terrestrial applications the use of such cells results in a decrease of the total amount of cost per Watt, if the sunlight is concentrated.

Currently, double and triple junction cells are being fabricated by several companies using monolithically stacked cells, where germanium is used as a substrate material as well as an active layer. Fabricating monolithically stacked four junction cells and optimizing the current matching for obtaining a high-energy conversion at the end of life (EOL) is quite complex, considering that the various junctions degrade at a different rate.

To lessen the need for current matching, it is interesting to look at the possibility of mechanical stacking of cells. A four terminal stack consisting of a top cell of two junctions in combination with a separate bottom cell is a good compromise between interconnection complexity and growth complexity. Germanium is a suitable material for realizing this bottom cell, because of its low energy band gap, low weight, and relatively low substrate cost.

A stand-alone germanium cell can be used as a bottom cell as a part of a high efficient multi-junction solar cell.

Furthermore a germanium cell is—it itself—an interesting option for use as a receiver in a thermo photovoltaic (TPV) system, where it is used to convert specific radiation from a heat source. The use of germanium in a TPV system is especially interesting because of its relatively low substrate cost compared to other low band gap semiconductors like GaSb. In order to make the application of the germanium solar cell in a TPV system feasible, it will also be essential to keep the processing costs to a minimum.

The main problem of the current germanium cells is the need for good passivation of the front and backside. A good front side passivation is especially critical in germanium cells, because Ge has a quite high absorption coefficient, which causes the light to be absorbed close to the surface and thus makes the device extremely sensitive to recombination at the surface.

Surface passivation can be achieved by applying a certain material on the surface, which fills the dangling bonds and thereby reduces the amount of recombination centers at this surface. For example, materials like silicon oxide, silicon nitride or amorphous semiconductors can be used. These layers can be applied by techniques like chemical vapor deposition (CVD) or sputtering. Depending on the chosen method significant differences in material properties and passivation behavior can be obtained. Especially important with respect to passivation are the amount of hydrogen in the layer and the damage to the surface that is caused by the deposition technique.

European Patent Application No. EP-A-374244 is related to a method of fabricating a solar cell from a silicon substrate on which a passivation layer consisting of silicon nitride is applied, after which contacts are created by applying a silver containing paste onto the passivation layer and 'firing through' the contacts, i.e., subjecting the substrate to a diffusion step, so that silver particles penetrate the silicon nitride layer and make contact with the substrate. The process conditions and the materials chosen for this process are, however, unsuitable for a germanium substrate.

In P. N. Luke et al., 'Germanium Orthogonal Strip detectors with Amorphous-Semiconductor contacts', 1999 IEEE Nuclear Science Symposium Conference Record, Seattle Wash., 25-28 Oct. 1999, a contact layer of amorphous germanium with thickness of 100 nm is sputtered onto the surface of a germanium detector. The amorphous semiconductor layer functions as a blocking junction and acts as a passivation coating for the germanium surface. The provision of contacts as required for solar cells is not discussed.

The formation of contacts after the passivation of a germanium solar cell front side is not obvious. The properties of the germanium substrate and possibly passivation layer should not be altered significantly during this process, which limits process conditions as for instance processing temperatures (preferably kept below 300° C.).

SUMMARY OF THE INVENTION

Various aspects provide a novel method for passivating and contacting a germanium surface. The germanium surface is preferably a surface of a germanium solar cell, a germanium thermo photovoltaic cell, or a germanium photodetector. It can be, for instance, the front or back surface of the solar cell.

Other aspects provide a novel highly efficient germanium solar cell and a method for producing such a cell.

A first embodiment provides a novel method for passivating and contacting a germanium surface. Preferably the germanium surface is a surface of a germanium solar cell.

The method according to the first embodiment comprises a) providing a germanium substrate with a first surface; this germanium surface can be doped or undoped; b) depositing a layer of amorphous silicon on top of the germanium surface. Advantageously plasma enhanced chemical vapor deposition (PECVD) is used for deposition. Other state of the art techniques are possible. Preferably, the thickness of the layer is less than 500 nm. More preferably, the thickness of the layer is less than 300 nm. Even more preferably, the thickness of the layer is less than about 100 nm. Most preferably, the thickness of the layer is less than about 40 nm. Advantageously for efficient solar cell applications, the thickness of the layer is from about 10 to 40 nm, e.g., from about 15 nm, 20 nm, or 25 nm to about 30 nm, 35 nm, or 40 nm. Of particular note are the cleaning treatment preceding the deposition, gas flow composition and applied RF-power for forming the plasma. Preferably, the PECVD is performed at a wafer temperature of from about 150° C. to about 250° C. or 300° C., e.g., from about 160° C., 170° C., 180° C., 190° C., 200° C., or 210° C. to about 220° C., 230° C., 240° C., 250° C., 275° C., or 300° C. A higher deposition temperature results in out-diffusion of the hydrogen within the material, which subsequently results in less desirable passivation properties; c) depositing a patterned layer of metal on top of the layer of amorphous silicon. This can be done by any state of the art technique. Preferably the metal is a highly conductive metal such as Pd, Cu, Ag, or Au. Also, a multi-layer comprising two or more different metal layers can be applied, such as Pd/Ag, Pd/Au, or Pd/Cu. This step can comprise different sub steps. This layer can be patterned to form a contact grid; and d) "Firing through" or diffusion of the metal through the layer of amorphous silicon by applying a temperature step, such that the germanium surface is contacted. The diffusion step should be chosen such that the process can be controlled. The effect of the diffusion or fire through is that metal particles of the contact layer penetrate through the amorphous silicon passivation layer to form a conductive path between the contact and the Ge-substrate. The resulting contacting resistivity is preferably lower than $5.10^{-4}$ $\Omega cm^2$, more preferably lower than $10^4$ $\Omega cm^2$, most preferably lower than $10^{-5}$ $\Omega cm^2$. The quality of the passivation layer is strongly affected by the cleaning treatment preceding the deposition. For instance a wet-chemical HF-dip and a $H_2$ plasma can be used to prepare the surface.

In FIG. 5 the measured effective minority carrier lifetime is plotted in function of the duration of the exposure time of the substrate to the $H_2$ plasma during the preliminary cleaning step. The amount of exposure plays a significant role in the optimization of the solar cell efficiency.

A further improvement of the quality of the passivation is achieved by optimizing the layer thickness. A too thin layer results in lower quality passivation properties, while a too thick layer absorbs a bigger part of the solar spectrum. For application in a mechanically stacked solar cell, or in a TPV cell the restrictions concerning the thickness are less stringent since in these applications the part of the spectrum that is used by the germanium cell will not be absorbed in the amorphous silicon layer.

In a first aspect of the first embodiment, the method can be used for the production of a germanium solar cell. The method according to the first aspect of the first embodiment comprises the following steps (see FIG. 1).
Step A.
Providing a p-type (or alternatively n-type) germanium substrate (1); and forming the emitter (n⁺ region, 2) in the p-type germanium substrate, by means of diffusion using a source of spin-on dopant (3) (SOD, preferably comprising phosphorous (P)). A possible alternative is the reversed situation with a p⁺ emitter in the n-type substrate. The most relevant parameters are the diffusion time, diffusion temperature, diffusion atmosphere, and the phosphorous content of the SOD. The diffusion temperature is preferably from about 500 to about 700° C. More preferably a temperature of about 600° C. is used. The diffusion time is preferably from about 10 seconds to about 20 minutes. More preferably a diffusion time of about 30 seconds is used. The diffusion atmosphere is preferably a forming gas such as $N_2+H_2$ (10%). Subsequent to the diffusion the spin-on material is removed using an HF solution.
Step B.
Application of the back contact (4) and formation of the back-surface field (BSF), using preferably aluminum applied by evaporation. Subsequently the Al is diffused into the substrate by applying a temperature step in a forming gas (preferably $N_2+H_2$(10%)) to create a p⁺ zone that serves as a back surface field (BSF) (5). Preferably an about 1 μm thick aluminum layer is evaporated. The diffusion temperature is preferably from about 350 to about 600° C. The diffusion time is preferably from about 10 minutes to about 60 minutes. The diffusion atmosphere is preferably a forming gas such as $N_2+H_2$ (10%).
Step C.
Defining the solar cell area by etching the mesa structures.
Step D.
Passivation of the front side by applying a very thin layer of intrinsic hydrogenated amorphous silicon (Si:H) (6) using plasma enhanced chemical vapor deposition (PECVD). Preferably the surface is prepared by a wet-chemical treatment using HF and subsequently applying a $H_2$ plasma, inside the deposition chamber, performed just before the deposition of the amorphous silicon. Preferably the applied RF power is less than 50 Watt. More preferably the power is less than 15 Watt. The exposure time is preferably less than 2 minutes; more preferably the exposure time can be chosen between 30 and 45 seconds. Preferably the thickness of the layer is less than 100 nm. More preferably a thickness of smaller then 40 nm or 50 nm can be chosen. For solar cell applications, a thickness of 10 to 40 or 50 nm can be advantageous. Thicker layers would absorb too much light, which can be disadvantageous when a high efficiency of a solar cell is important. Gas flow composition and applied RF-power are critical for forming the plasma. Preferably the PECVD is performed at a wafer temperature of from about 150 to about 250° C. Preferably the plasma is from about 6 to about 20 Watts. Preferably the gas composition comprises from about 20 to about 100 sccm $SiH_4$ and from about 0 to about 600 sccm $H_2$.
Steps E and F.
Application of the front contact by evaporation of the metal, preferably silver (Ag) copper (Cu) or gold (Au) contact structure (E), using preferably lift-off to define the finger pattern (F,7). For instance an about 2 μm thick metal layer can be used. Alternatively a multi-layer of different types of metal can be used like Pd/Ag, Pd/Cu, or Pd/Au. The material of the first layer, preferably Pd, is diffused through the passivation layer to obtain a low contact resistance. The second, preferably highly conductive metal layer such as Ag, Cu or Au, serves to obtain a low series resistance. The second layer can be evaporated or applied by electro-plating. For instance a multi-layer comprising a 50 nm layer and a 2 μm layer can be applied. Cu as a second layer in the multilayer can be advantageous since it can be applied via electroplating and thus allow formation of thick layers (e.g., thicker then 2 microns), which can be desirable in applications where high currents are generated, as in, for instance, thermo-photovoltaic systems or concentrator systems.
Step G.
Firing through the amorphous silicon layer of the applied metal contacts (diffusion of the metal through the passivating amorphous silicon layer) in order to obtain a good contact with the n⁺ germanium emitter. Critical are the diffusion time and temperature. The diffusion temperature is preferably from about 150 to about 300° C., for instance, about 220° C. More preferably a temperature of from about 160 or 170 °C. to about 250° C. is used, and most preferably, a temperature of from about 180° C. to about 230° C. or 240° C. is used. The diffusion time is preferably between 1 min and 60 min. Depending on the thickness of the passivation layer, the optimal diffusion time will change. The diffusion atmosphere is preferably a forming gas (as N2+H2 (10%)).
Step H.
Evaporation of the anti-reflective coating (8) using preferably zinc sulfide (ZnS) and magnesium fluoride ($MgF_2$).

In a second embodiment, a method of passivating and contacting a surface of a germanium substrate is provided, including: (a) providing a germanium substrate having a first surface; (b) forming a passivation layer of amorphous silicon material on the first surface; (c) forming a contact layer of metal on the passivation layer; (d) heating the substrate and layers so that the first surface makes contact with the contact layer through the passivation layer.

In an aspect of the second embodiment, the contact resistivity is less than about $10^{-4}$ $\Omega cm^2$.

In an aspect of the second embodiment, the method further includes cleaning the first surface before forming the passivation layer, the cleaning including applying wet-chemical HF treatment and a $H_2$ containing plasma to the first surface.

In an aspect of the second embodiment, forming the passivation layer is performed by plasma enhanced chemical vapor deposition (PECVD).

In an aspect of the second embodiment, the PECVD is performed at a temperature of from about 150° C. to about 300° C.

In an aspect of the second embodiment, the passivation layer has a thickness of less than about 100 nm.

In an aspect of the second embodiment, the passivation layer has a thickness of less than about 40 nm.

In an aspect of the second embodiment, the passivation layer has a thickness of from about 10 nm to about 50 nm.

In an aspect of the second embodiment, the first surface is a surface of a germanium solar cell, a thermo photovoltaic cell, or a photodetector.

In an aspect of the second embodiment, the contact layer includes Ag, Au, Pd, or Cu. The contact layer can also comprise a multi-layer, as for instance Pd/Ag, Pd/Au, or Pd/Cu multi-layers.

In an aspect of the second embodiment, the contact layer is patterned to form a contact grid.

In an aspect of the second embodiment, the heating is performed at a temperature lower than about 300° C.

In an aspect of the second embodiment, the heating is performed at a temperature of from about 180° C. to about 240° C.

In an aspect of the second embodiment, the method further includes (a) forming an emitter area in the germanium substrate; (b) forming a back contact on a second surface of the germanium substrate and thereby realizing a back surface field; (c) etching mesa structures so as to define photo voltaic cell regions; and (d) forming an antireflective coating on the exposed parts of the passivation layer and the contact layer.

In an aspect of the second embodiment, the forming of an emitter area, forming a back contact, and etching mesa structures are performed before forming a passivation layer.

In an aspect of the second embodiment, forming an antireflective coating is performed after the heating.

In a third embodiment, a passivated germanium substrate is provided, including a germanium substrate including a first surface; a passivation layer of plasma enhanced chemical vapor deposition (PECVD) deposited amorphous silicon material formed on the first surface; and a metal contacting layer on the passivation layer contacting the substrate through the passivation layer, by particles of the metal having penetrated into the passivation layer and thereby having formed a conductive path between the contacting layer and the germanium substrate.

In an aspect of the third embodiment, the passivation layer includes a conductive material in an area underlying the contacting layer and between the contacting layer and the germanium substrate.

In an aspect of the third embodiment, the passivation layer has a thickness of from about 10 to about 40 nm.

In a fourth embodiment, a photovoltaic device is provided including a germanium substrate including a first surface; a passivation layer of plasma enhanced chemical vapor deposition (PECVD) deposited amorphous silicon material formed on the first surface; and a contacting layer including a conductive material formed on the passivation layer.

In a fifth embodiment, a method of passivating and contacting a surface of a germanium substrate is provided, comprising: providing a germanium substrate having a first surface; cleaning the first surface by applying a wet-chemical HF dip to the first surface and thereafter applying a $H_2$ containing plasma to the first surface; forming a passivation layer of amorphous silicon material on the first surface; forming a contact layer of metal on the passivation layer; and heating the substrate and the layers so that the first surface makes contact with the contact layer through the passivation layer. The method can further comprise forming an emitter area in the germanium substrate; forming a back contact on a second surface of the germanium substrate and thereby realizing a back surface field; etching mesa structures so as to define photo voltaic cell regions; and forming an antireflective coating on the exposed parts of the passivation layer and the contact layer.

Figure 2:
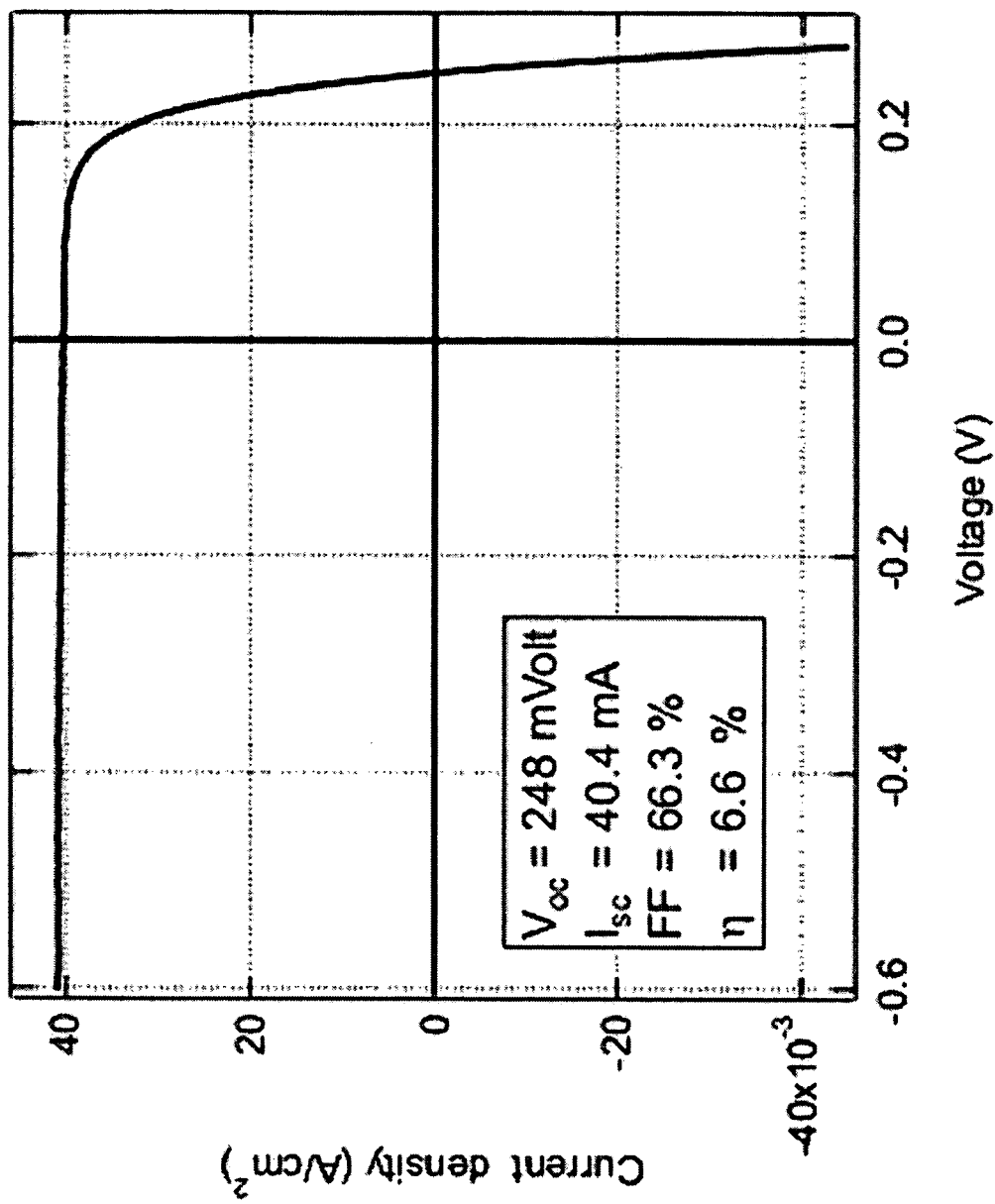
FIGS. 2 and 3 illustrate the performance of a solar cell according to a preferred embodiment.

As shown in the current-voltage characteristic shown in FIG. 2, the short circuit current ($J_{sc}$) is equal to 40.4 mA/cm$^2$, the open circuit voltage Voc is equal to 248 mV and the fill factor (FF) was found to be 66.3%. An AM1.5 efficiency of 6.64% was measured.

Figure 3:
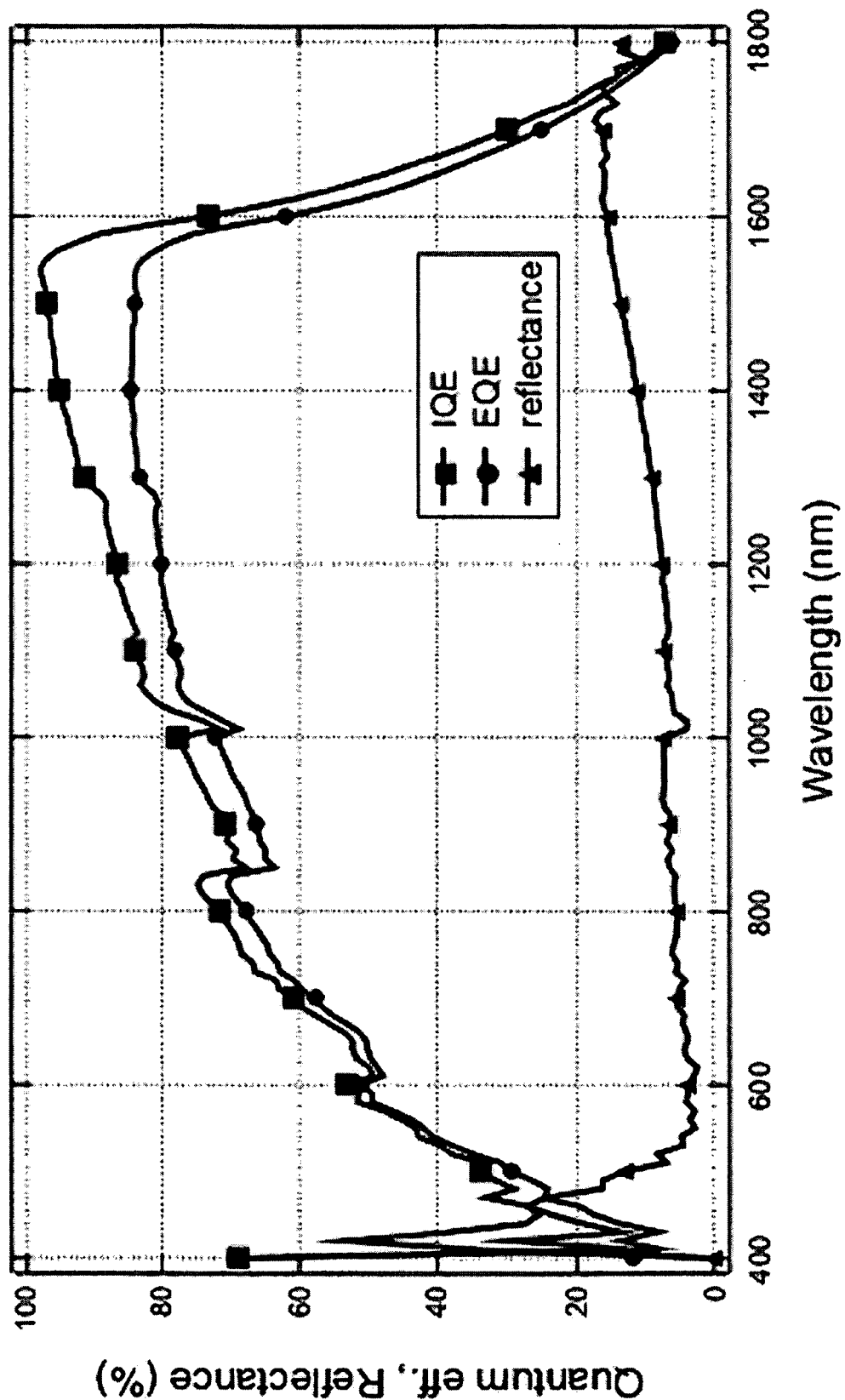

FIG. 3 illustrates the internal quantum efficiency, the external quantum efficiency and the reflectance of a solar cell created by a preferred embodiment of the present invention, in function of the wavelength of the incoming light. The good quality of the passivation layer is shown by the excellent response at low wavelengths.

Figure 4:
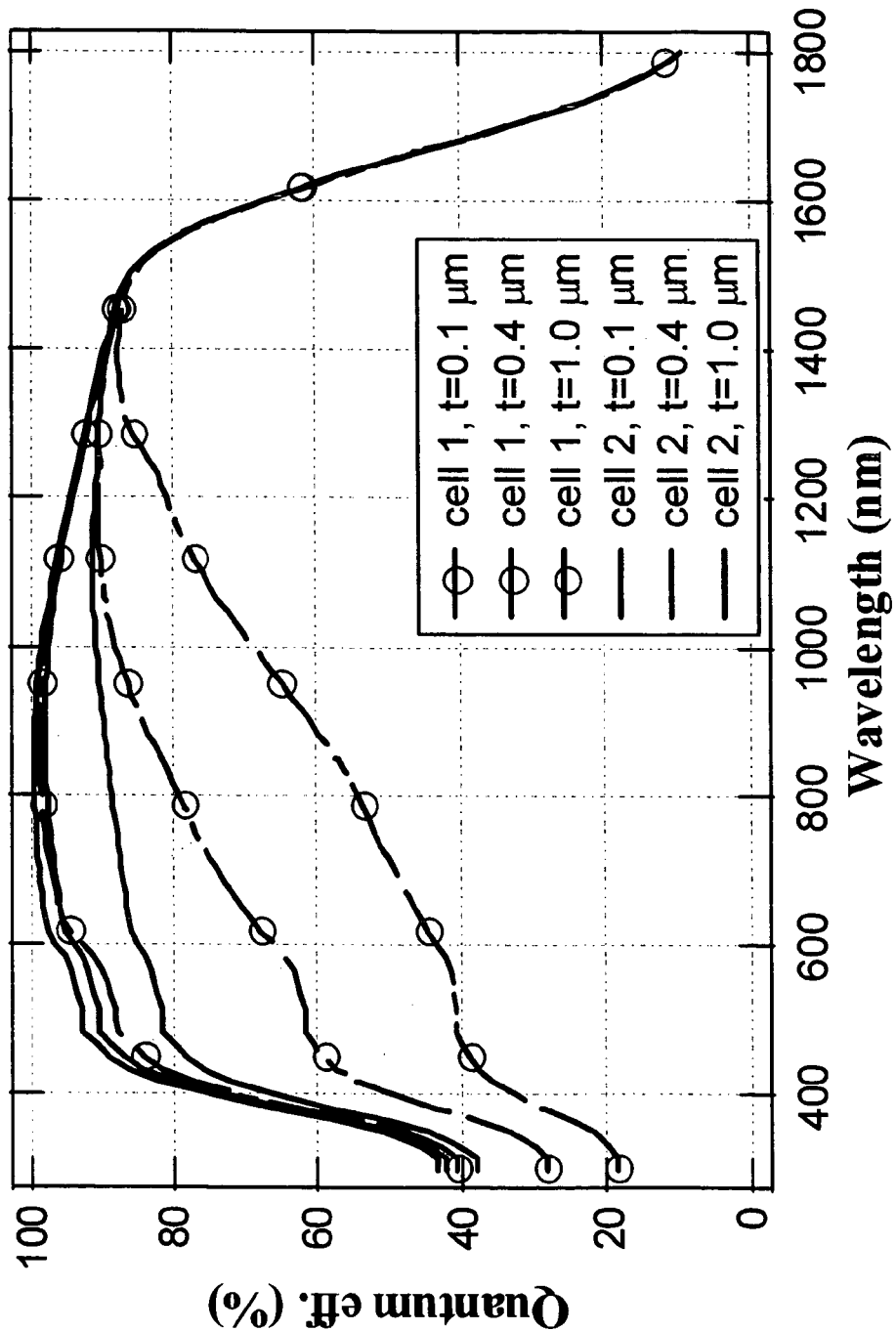

FIG. 4 shows simulation results were the emitter thickness and surface recombination velocities have been varied.

Figure 5:
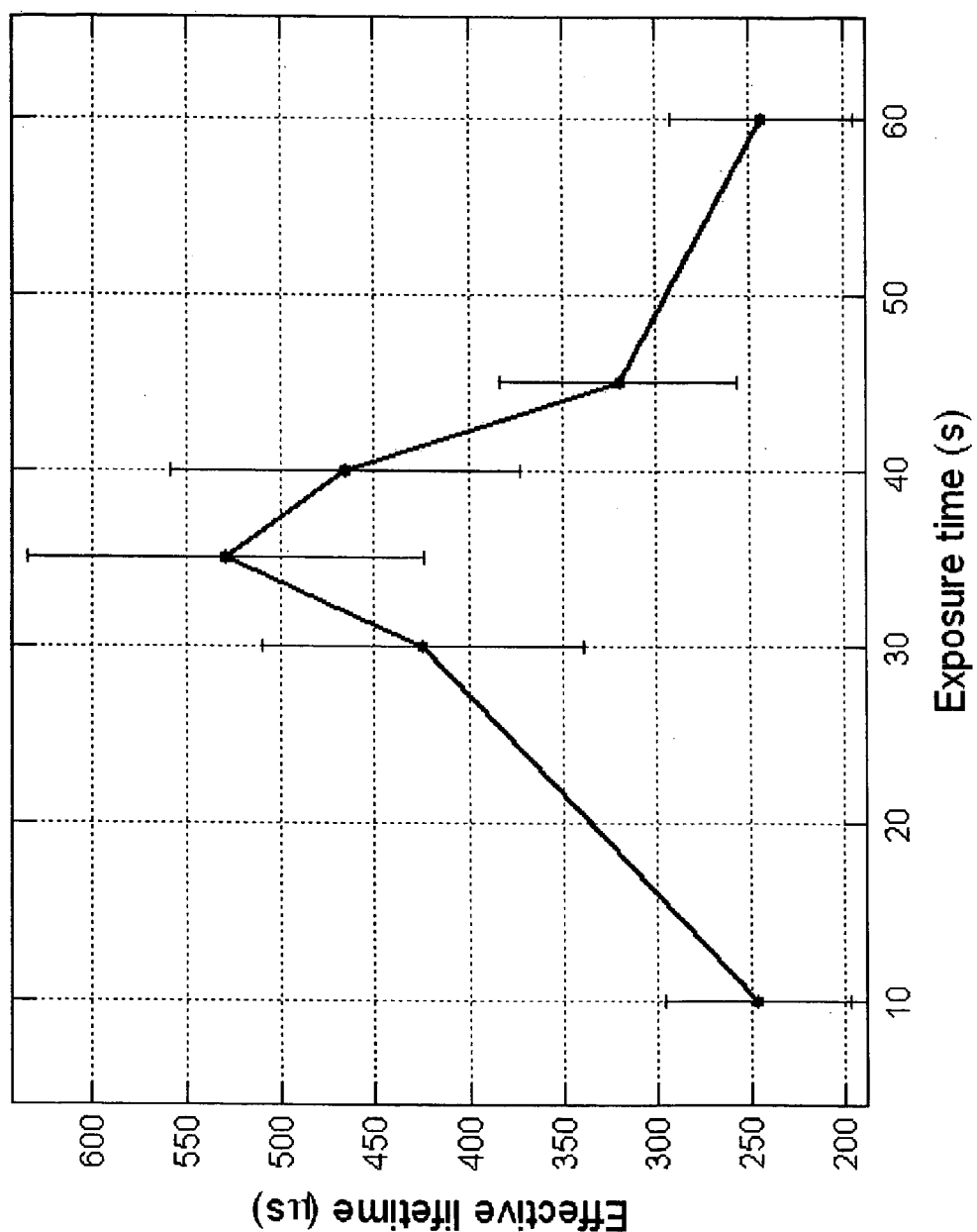

FIG. 5 is the carrier lifetime is plotted in function of the duration of the exposure time of the substrate to the $H_2$ plasma during the preliminary cleaning step.

DETAILED DESCRIPTION OF THE PREFERRED EMBODIMENT

Figure 1:
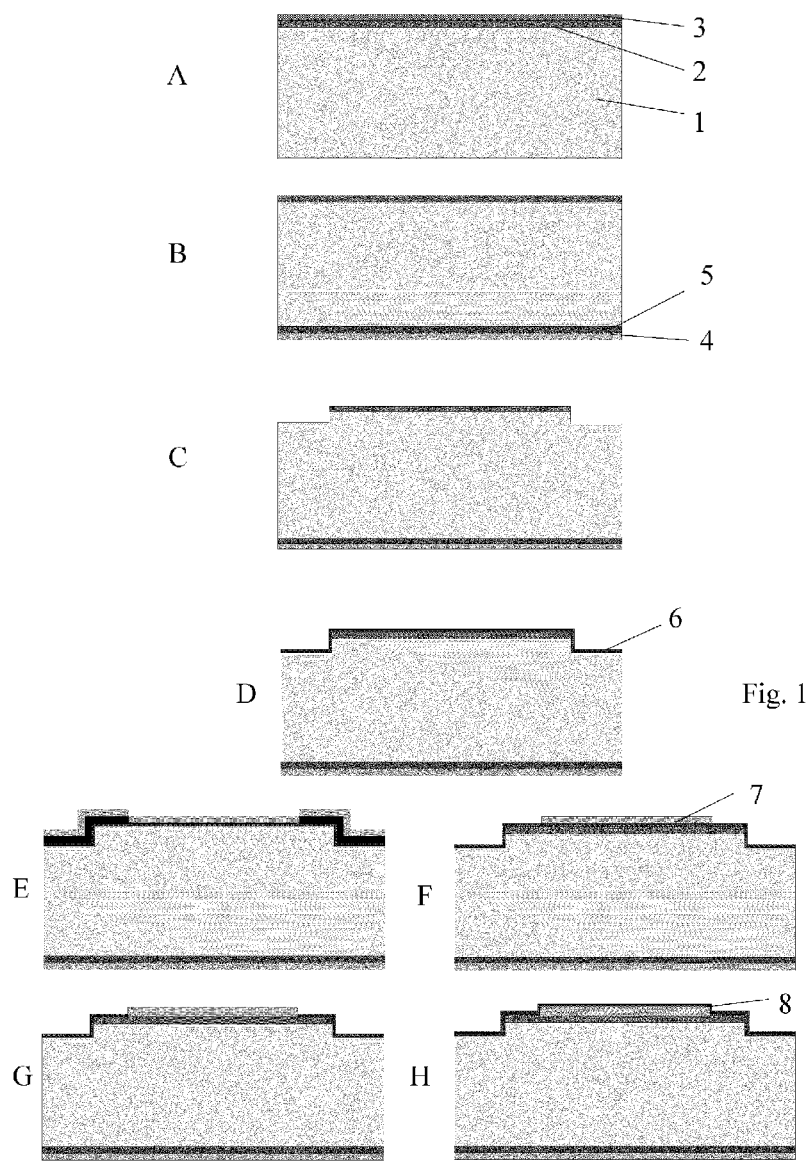
FIG. 1 illustrates an embodiment whereby a germanium solar cell is produced, passivated by the method according to the present invention (FIG. 1).

A preferred embodiment of a method or the production of a germanium solar cell comprises the following steps (FIG. 1):

Step A.

Providing a p-type germanium substrate (1) and forming the emitter (n$^+$ region, 2) in the p-type germanium substrate, by means of diffusion using a source of spin-on dopant (3). A diffusion temperature of 600° C. and a diffusion time of 30 seconds were used. The diffusion atmosphere was a forming gas, N$_2$+H$_2$ (10%).

Step B.

Application of the back contact (4) and realization of the back-surface field (BSF) (5), using aluminum applied by evaporation. Subsequently the Al is diffused into the substrate by applying a temperature step in forming gas (N$_2$+H$_2$(10%)) to create a p$^+$ zone that serves as a back surface field (BSF) (5). A 1 µm thick aluminum layer was evaporated. The diffusion temperature was between 350 and 600° C. The diffusion time is between 10 minutes and 60 minutes. The diffusion atmosphere is a forming gas N2+H2 (10%).

Step C.

Defining the solar cell area by etching the mesa structures.

Step D.

Passivation of the front side by applying a very thin layer of intrinsic hydrogenated amorphous silicon (Si:H) (6) using plasma enhanced chemical vapor deposition (PECVD) at a substrate temperature of 170° C. A layer with thickness of 10 nm was deposited. The plasma power was between 6 and 20 Watts. The gas composition was comprised between 20 to 100 sccm $SiH_4$ and between 0 to 600 sccm $H_2$. The surface is prepared by a wet-chemical HF treatment and a $H_2$ plasma.

Steps E and F.

Application of the front contact by evaporation of the palladium (Pd) silver (Ag) multi-layer contact structure (E), using lift-off to define the finger pattern (F,7). The lift off comprised selectively depositing a resist layer on the layer of amorphous silicon before the Pd/Ag deposition. After the following Pd/Ag deposition the resist is removed—together with the Pd/Ag deposited on the resist, such that only the area where no resist had been applied remains covered with Ag. A 50 nm palladium and a 2 µm thick silver layer were used.

Step G.

Firing through the amorphous silicon layer of the applied Pd/Ag contacts (diffusion of palladium through the passivating amorphous silicon layer) in order to obtain a good contact with the $n^+$ germanium emitter. Critical are the diffusion time and temperature. A diffusion temperature of 220 ° C. and a diffusion time of about 2 to 20 minutes were used. The diffusion atmosphere was a forming gas (N2+H2 (10%)).

Step H.

Evaporation of the anti-reflective coating (8) using zinc sulfide (ZnS) and magnesium fluoride ($MgF_2$).

FIGS. 2 and 3 illustrate the performance of a solar cell according to a preferred embodiment of the present invention. As shown in the current-voltage characteristic shown in FIG. 2, the short circuit current ($J_{sc}$) is equal to 40.4 nA/cm², the open circuit voltage Voc is equal to 248 mV and the fill factor (FF) was found to be 66.3%. An AM1.5 efficiency of 6.64% was measured.

FIG. 3 illustrates the internal quantum efficiency, the external quantum efficiency, and the reflectance of a solar cell created by a preferred embodiment of the present invention, in function of the wavelength of the incoming light.

Important for the fabrication of a germanium cell with efficiencies as shown by the cell obtained by application of the techniques of the preferred embodiments, is thickness of the emitter and the applied surface passivation technique. FIG. 4 shows simulation results where the emitter thickness and surface recombination velocities have been varied. Cell 1 has a simulated front surface recombination velocity ($S_{front}$) of 70000 cm/s and cell 2 has $S_{front}$ equal to 50 cm/s. With decreasing emitter depth and decreasing recombination velocity at the front surface the response of the cell improves.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method of passivating and contacting a surface of a germanium substrate, comprising, in sequence:
   (a) providing a germanium substrate;
   (b) forming an emitter in the germanium substrate;
   (c) forming a passivation layer of an amorphous silicon material on a surface of the emitter, whereby the surface of the emitter is passivated;
   (d) forming a contact layer on the passivation layer, wherein the contact layer comprises a first metal layer, the first metal layer comprising at least one of palladium and copper; and
   (e) heating the substrate and the layers, whereby metal particles derived from the first metal layer diffuse through the passivation layer to yield a metal-diffused amorphous silicon passivation layer, the diffused metal particles providing a conductive path between the contact layer and the emitter, wherein the contact layer is atop the metal-diffused amorphous silicon passivation layer, and wherein the metal-diffused amorphous silicon passivation layer is atop the emitter.

2. The method according to claim 1, wherein a contact resistivity of the conductive path between the contact layer and the emitter is less than about $10^{-4}$ $\Omega cm^2$.

3. The method according to claim 1, further comprising cleaning the surface of the emitter before forming the passivation layer, the cleaning comprising applying a $H_2$ containing plasma to the surface of the emitter.

4. The method of claim 1, further comprising cleaning the surface of the emitter before forming the passivation layer, the cleaning comprising applying a wet-chemical HF dip to the surface of the emitter.

5. The method according to claim 1, wherein forming the passivation layer is performed by plasma enhanced chemical vapor deposition.

6. The method according to claim 5, wherein the plasma enhanced chemical vapor deposition is performed at a temperature of from about 150° C. to about 300° C.

7. The method according to claim 1, wherein the passivation layer has a thickness of less than about 100 nm.

8. The method according to claim 1, wherein the passivation layer has a thickness of less than about 40 nm.

9. The method according to claim 1, wherein the passivation layer has a thickness of from about 10 nm to about 50 nm.

10. The method according to claim 1, wherein the surface of the emitter is a surface of a germanium solar cell, a thermo photovoltaic cell, or a photodetector.

11. The method according to claim 1, wherein the contact layer further comprises an additional metal layer, the additional metal layer comprising at least one of Cu, Ag, and Au.

12. The method according to claim 1, wherein the first metal layer is deposited atop the passivation layer, and wherein the additional metal layer is deposited atop the first metal layer.

13. The method according to claim 11, wherein the additional metal layer is deposited by evaporation.

14. The method according to claim 11, wherein the additional metal layer is deposited by electroplating.

15. The method according to claim 1, further comprising patterning the contact layer to form a contact grid, wherein patterning is conducted before heating the substrate and the layers.

16. The method according to claim 1, wherein the heating is performed at a temperature lower than about 300° C.

17. The method according to claim 1, wherein the heating is performed at a temperature of from about 180° C. to about 240° C.

18. The method according to claim 1, further comprising:
(a) forming a back contact on a back surface of the germanium substrate, thereby forming a back surface field;
(b) etching mesa structures so as to define photovoltaic cell regions; and
(c) forming an antireflective coating on exposed parts of the passivation layer and the contact layer.

19. The method according to claim 17, wherein forming a back contact and etching mesa structures are performed before forming a passivation layer.

20. The method according to claim 17, wherein forming an antireflective coating is performed after heating the substrate and the layers.

21. A method of passivating and contacting a surface of a germanium substrate, comprising, in sequence:
(a) providing a germanium substrate having a first surface;
(b) forming an emitter area in the germanium substrate;
(c) cleaning the first surface by applying a wet-chemical HF dip to the first surface and thereafter applying a $H_2$ containing plasma to the first surface;
(d) forming a passivation layer of amorphous silicon material on the first surface;
(e) forming a contact layer of metal on the passivation layer; and
(f) heating the substrate and the layers, whereby metal particles derived from the first metal layer diffuse through the passivation layer to yield a metal-diffused amorphous silicon passivation layer, the diffused metal particles providing a conductive path between the contact layer and the emitter, wherein the contact layer is atop the metal-diffused amorphous silicon passivation layer, and wherein the metal-diffused amorphous silicon passivation layer is atop the emitter.

22. The method according to claim 21, further comprising:
(a) forming a back contact on a second surface of the germanium substrate and thereby realizing a back surface field;
(b) etching mesa structures so as to define photo voltaic cell regions; and
(c) forming an antireflective coating on the exposed parts of the passivation layer and the contact layer.

23. The method according to claim 1, wherein relative positions of the germanium substrate, the emitter, the passivation layer, and the contact layer are the same before and after step (e).

24. The method according to claim 21, wherein relative positions of the germanium substrate, the emitter area, the passivation layer, and the contact layer are the same before and after step (f).

* * * * *